(12) United States Patent
Herbert

(10) Patent No.: US 7,915,537 B1
(45) Date of Patent: Mar. 29, 2011

(54) INTERPOSER AND METHOD FOR MAKING INTERPOSERS

(76) Inventor: Edward Herbert, Canton, CT (US)

( * ) Notice: Subject to any disclaimer, the term of this patent is extended or adjusted under 35 U.S.C. 154(b) by 964 days.

(21) Appl. No.: 11/550,753

(22) Filed: Oct. 18, 2006

Related U.S. Application Data

(60) Provisional application No. 60/596,758, filed on Oct. 19, 2005.

(51) Int. Cl.
*H05K 1/03* (2006.01)
(52) U.S. Cl. .......................... 174/255; 174/262; 29/830
(58) Field of Classification Search .................. 174/255, 174/260, 261
See application file for complete search history.

(56) References Cited

U.S. PATENT DOCUMENTS 6,271,483 B1 * 8/2001 Horiuchi et al. ............... 174/265
6,332,782 B1 * 12/2001 Bezama et al. .................. 439/66

\* cited by examiner

*Primary Examiner* — Ishwarbhai B Patel

(57) ABSTRACT

An interposer is made of nested drawn copper shells with insulation between them. The shells are etched using methods of ordinary printed wiring fabrication, but being three dimensional, straight runs from the die to the motherboard can be made optimally short and wide without passing through any vias. Some shells can extend upward for top connections, and vias and crossing landlines can be used as required in the areas away from the die.

12 Claims, 9 Drawing Sheets

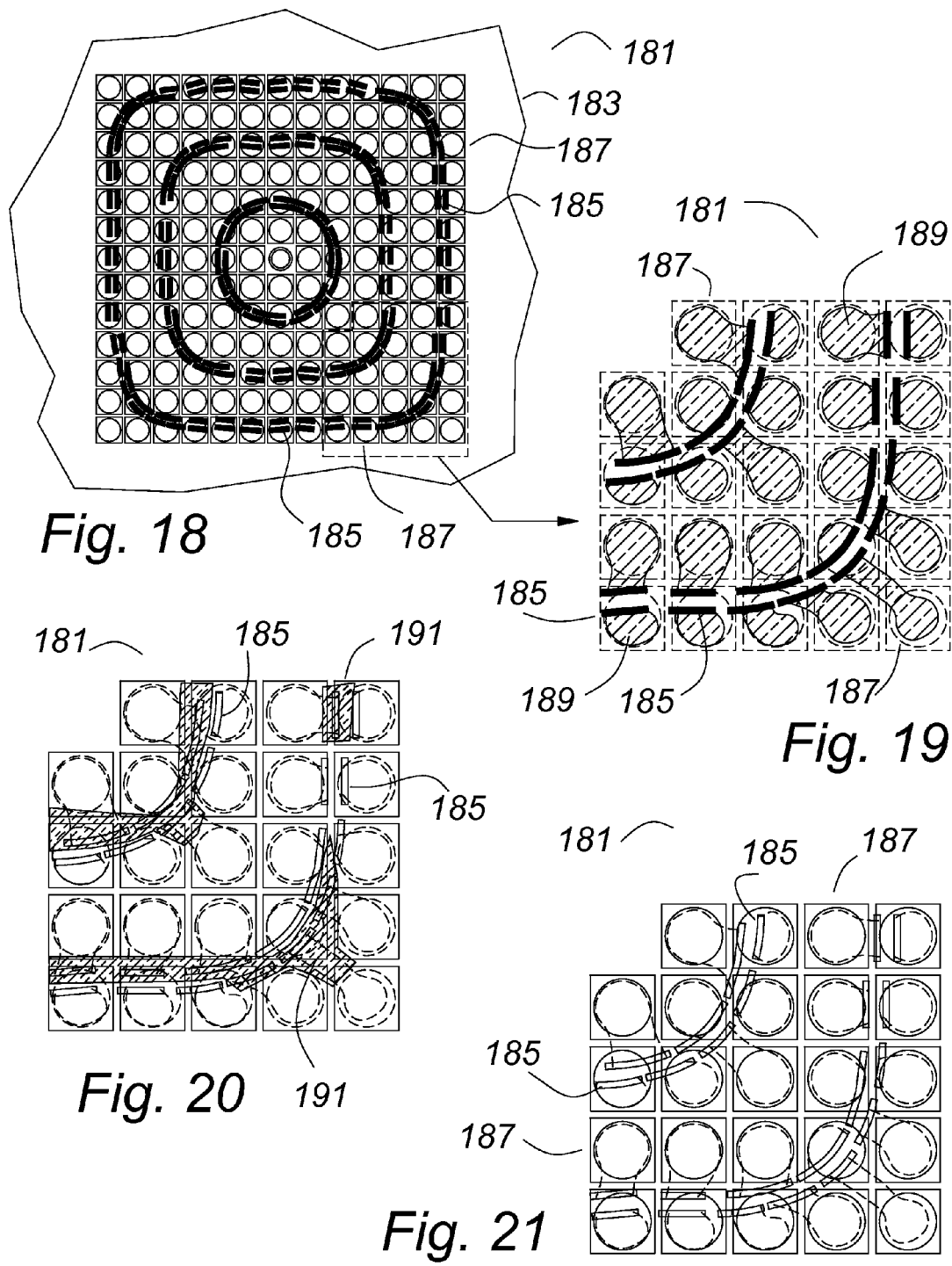

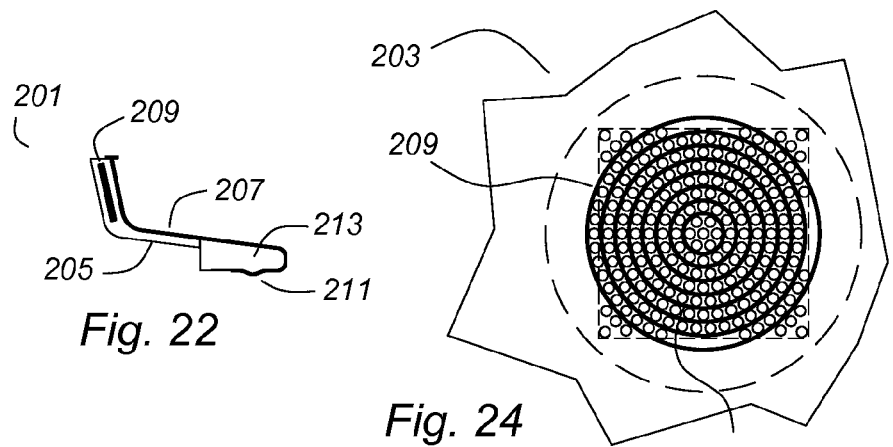
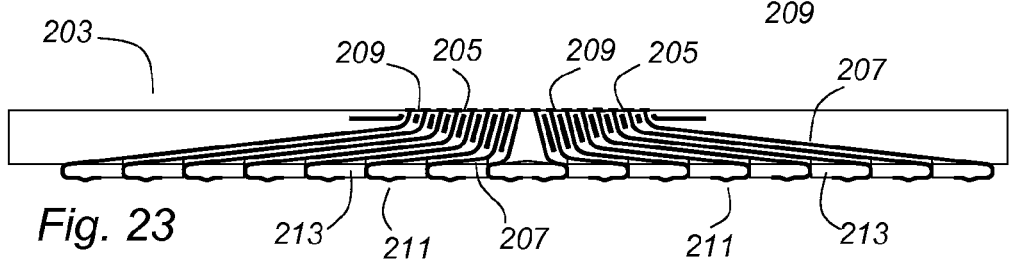
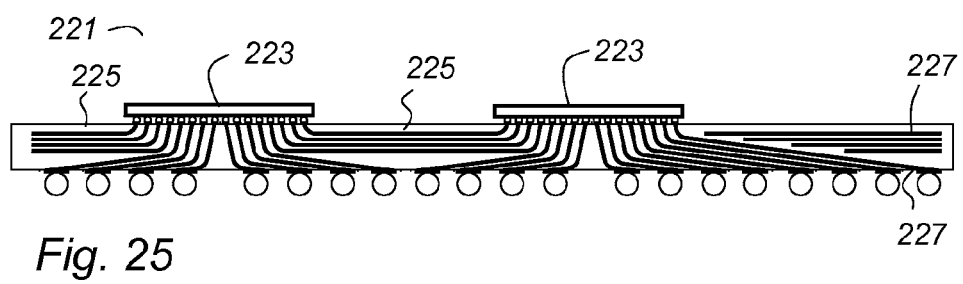
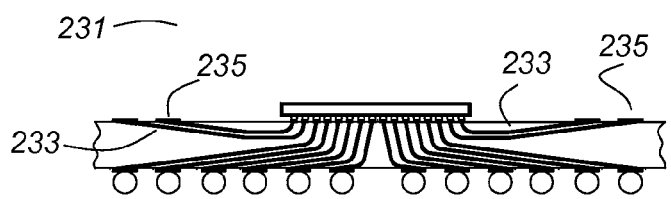
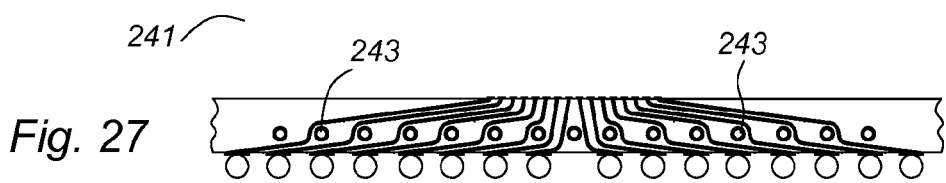

US 7,915,537 B1

INTERPOSER AND METHOD FOR MAKING INTERPOSERS

CROSS REFERENCE TO RELATED PATENT APPLICATION

This application claims priority to a provisional patent application of the same name, Ser. No. 60/596,758, filed Oct. 19, 2005. That application is incorporated herein by reference.

BACKGROUND OF THE INVENTION

This invention relates to interposers, the transitional circuit cards between integrated circuit dice, such as microprocessors, as an example, not a limitation, and a motherboard upon which they are to be mounted, often through connectors.

Prior art interposers are made as multilayer printed wiring boards with traces etched on planar conductor surfaces and with vias to connect from layer to layer. The need to use vias requires that circuit traces be reduced in width to provide clearance for vias that pass closely but do not connect. Vias in interposers tend to be very small and thus have high resistance.

Prior art interposers often have many hundreds of connections, and often many hundreds of the connections are devoted to power and ground connections. Despite the large number of parallel connections used, the impedance in the power circuits is quite high, in the order of 340 μΩ. In that the voltage used by processors is very low, in the order of 1 v, and the current is very high, in the order of 100 a peak, this is a significant problem.

SUMMARY OF THE INVENTION

The present invention teaches an interposer manufactured with techniques borrowed from printed wiring board manufacturing, but using formed conductor layers, not planar ones. This allows conductors to run from a contact of the integrated circuit directly to a contact on the motherboard without passing through any vias. The foil layers can be formed in any shape, as long as they can be nested, and they can be quite thick. Conceptually, the conduction layers can be visualized as nested funnels, or perhaps as the layers of an onion.

In one embodiment of the invention, the conduction layers can be formed with tabbed extensions that form springy contacts, making a connector unnecessary. While vias are problematical in the high current power conductors, they can be used conventionally as needed to cross patch conductors for logic signals for good alignment of the data buses in the motherboard.

A very low impedance connection for the power and ground connections is shown with interdigitated contacts straddling capacitors on the motherboard.

BRIEF DESCRIPTION OF THE DRAWINGS

FIG. 18 shows that the conductors from the internal layers can be misaligned.

FIGS. 19-21 show a method of correcting the misalignment.

FIG. 22 shows that reinforcement may be incorporated into the subassemblies of an interposer.

FIG. 23 shows a section of an interposer with reinforcement, and

FIG. 24 shows a top view of the connection area for the die.

FIG. 25 shows that the interposer may be adapted to multiple dice. It also shows that not all layers need to extend to the motherboard connection.

FIG. 26 shows that some layers can return to the top surface.

FIG. 27 shows that cooling ducts can be incorporated into an interposer.

DETAILED DESCRIPTION

Figure 1:
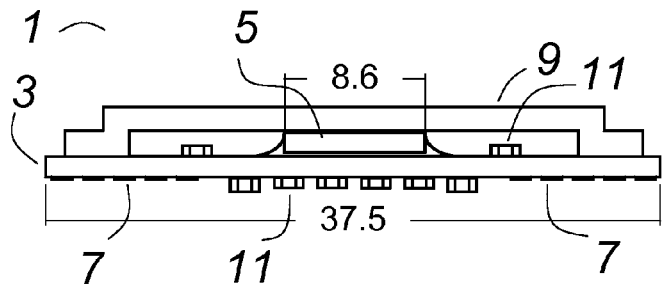
FIG. 1 shows a prior art processor package with an interposer. This is an accurate scale drawing of a production processor package.

FIG. 1 shows a scale drawing section of a representative production processor package 1. An interposer 3 provides a transition between a processor die 5 and contacts 7-7 which mate with an LGA connector, as an example, not a limitation, on a computer motherboard. A top cover 9 protects the processor die 5 and provides a heat-sinking surface. Components 11-11 may be mounted on the interposer, either on the top or on the bottom of the interposer 3.

Figure 2:
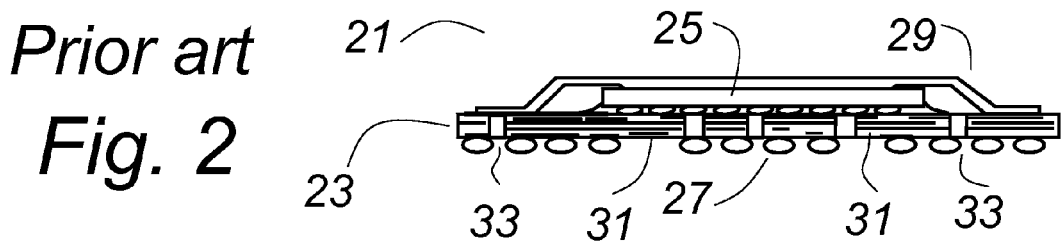
FIG. 2 shows a prior art processor package with an interposer. The planar conductors and vias can be seen in exaggerated scale.

FIG. 2 shows a section of another representative production processor package 21. An interposer 23 provides a transition between a processor die 25 and contacts 27 on the bottom of the processor package 21. A top cover 29 protects the processor die 25 and provides a heat-sinking surface. This drawing shows the planar conductive layers 31-31 and the vias 33-33 connecting them within the interposer 23 in exaggerated scale.

Figure 3:
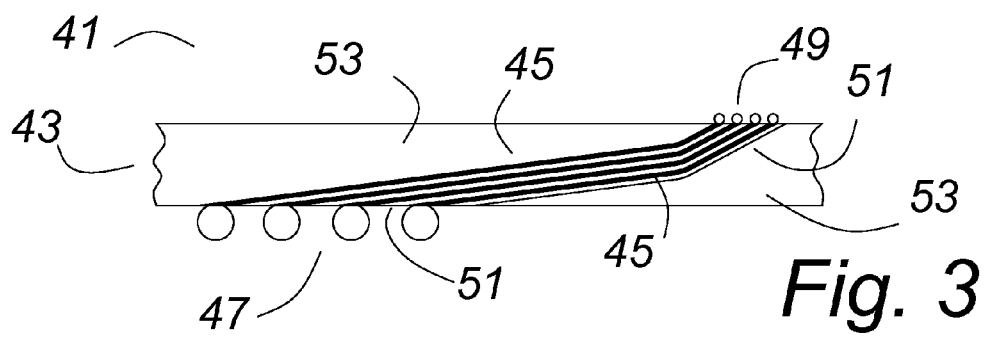
FIG. 3 shows a partial section of an interposer of this invention with optimally nested conduction layers.

FIG. 3 shows a partial section of an interposer 41 of this invention. Internal conductive layers 45-45 are routed in a generally diagonal direction from finer pitch contacts 49 at the top for connection to an integrated circuit die to coarser pitch contacts 47 on the bottom of the interposer 41 for connection to a motherboard or a connector thereon. In this interposer, the internal layers are optimally nested. This relationship exists if the angle at the top is the arcsine of the thickness of the conductive layer 45 with its insulation 51 to pitch of the top contacts 49 and if the angle at the bottom is the arcsine of the thickness of the conductive layer 45 with its insulation 51 to the pitch of the bottom contacts 47. If the top and bottom surfaces of the interposer 41 are to be parallel plain surfaces, extra filler material 53, 53 is needed to fill the empty spaces. This is true of many of the embodiments of the invention whether recited or not and the inclusion of such extra filler material is understood whether it is recited or not.

FIGS. 4 through 9 shows an interposer 61 of this invention. Internal conductive layers 65-65 are routed in a generally diagonal direction from the finer pitch contacts 69-69 a the top where an integrated circuit die would be located to the coarser pitch contacts 67-67 at the bottom. The conductive layers depart from the ideal packing arrangement shown in FIG. 3 to have a more vertical disposition near the integrated circuit die. This arrangement has less horizontal spreading, so the lower contacts are in a tighter arrangement. Truly vertical conductors could be used, but a slight angle is preferred to ensure that the layers will not interfere at assembly. In the figure, it can be seen that the very top of the nested conductors is vertical, so that the top surface can be trued up by machining or other operation without altering the spacing. This arrangement leaves spaces between the laminates at the top, and these spaces are preferably filled, either with filler pieces or with a potting material such as epoxy resin, as an example, not a limitation. If the top and bottom surfaces of the interposer 61 are to be parallel plain surfaces, extra filler material 63 is needed to fill the empty spaces.

The contacts 67-67 and 69-69 are shown as balls, which may be solder balls, as an example, not a limitation. Some interposers have solder ball contacts on their bottom surface to interface with special connectors designed for that purpose. The balls on the top of the interposer may represent ball bonds on the bottom of a processor integrated circuit (IC).

Figure 4:
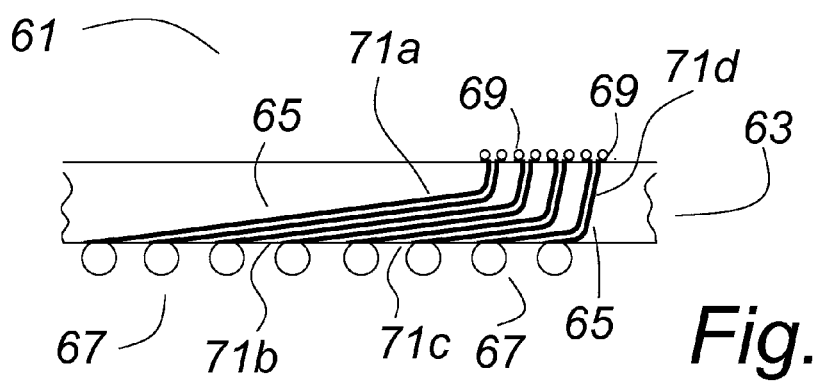
FIG. 4 shows another partial section of an interposer of this invention with more steeply sloped conductors under the area where the die will attach.

The layers of the interposer 61 comprise four laminates 71a-d, each having top and bottom conductive layers 65-65 with insulation between them. FIG. 4 is a section of one side of the interposer 61 only. Like numbers in different figures are like parts.

Figure 5:
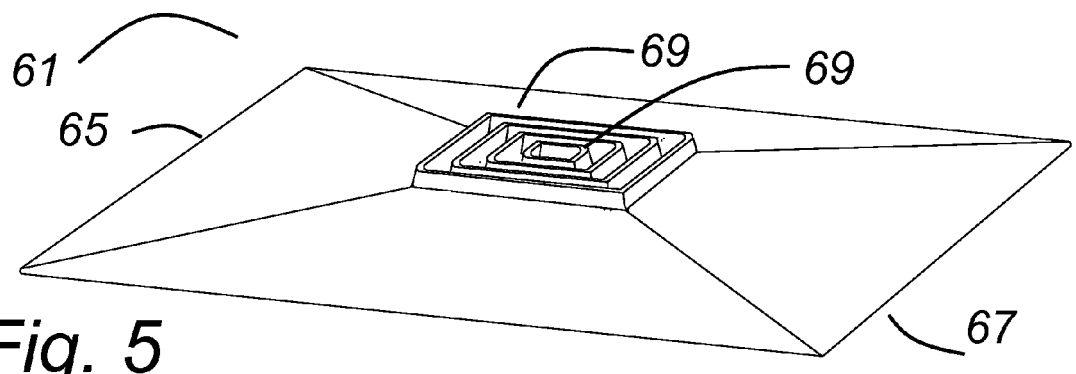
FIG. 5 shows a perspective view of four internal laminated layers of an interposer of this invention.
Figure 6:
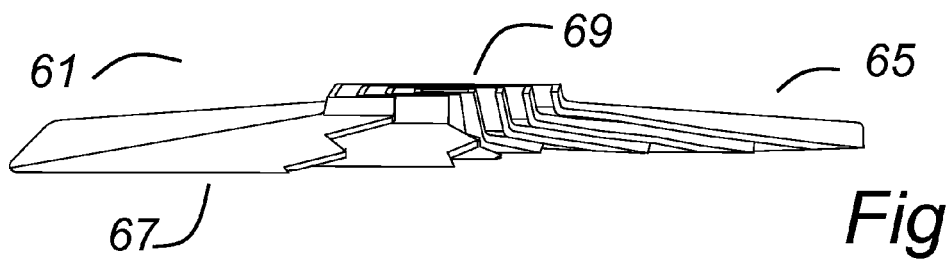
FIG. 6 shows the same four internal layers, partly cut away.
Figure 7:
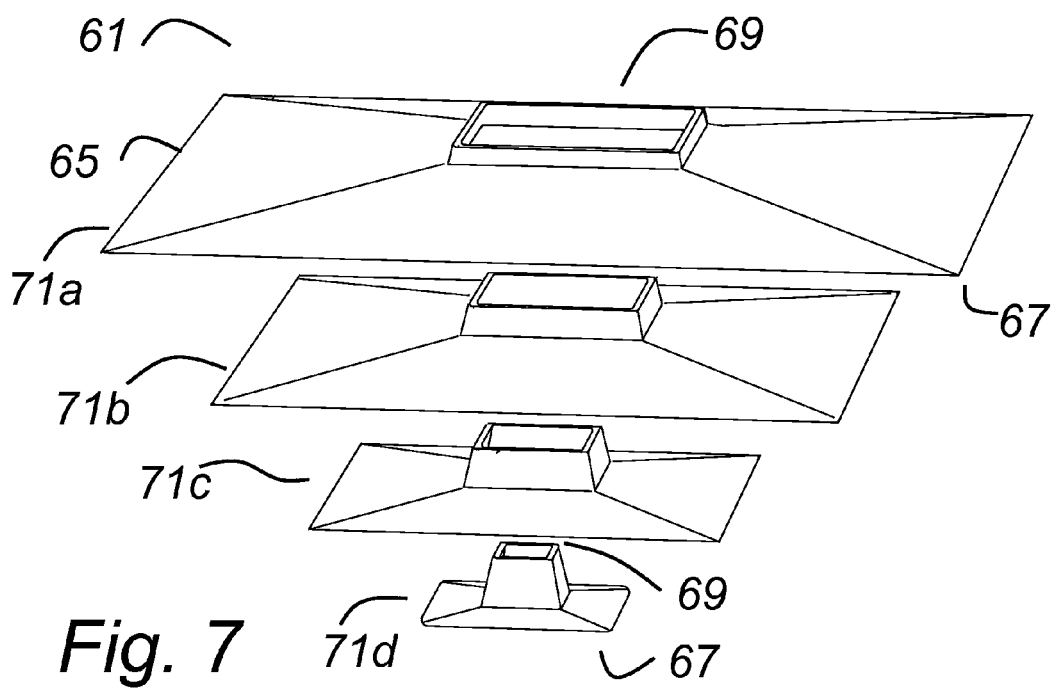
FIG. 7 shows an exploded view of the same four internal layers.
Figure 8:
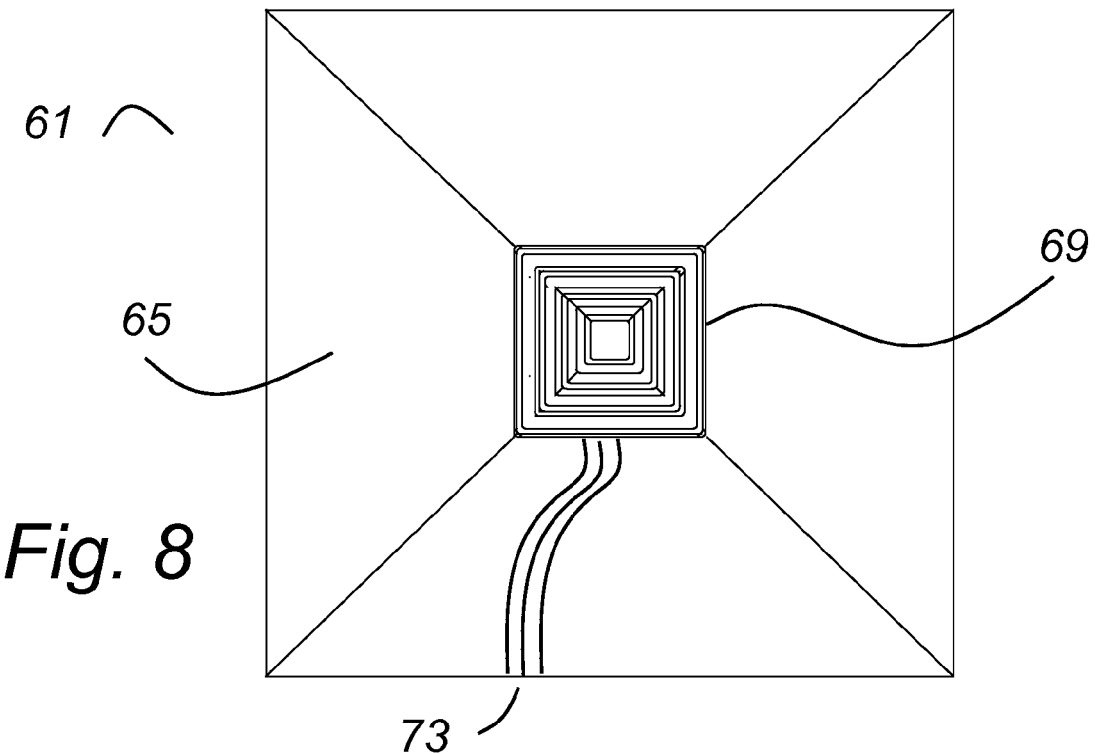
FIG. 8 shows a plan top.
Figure 9:
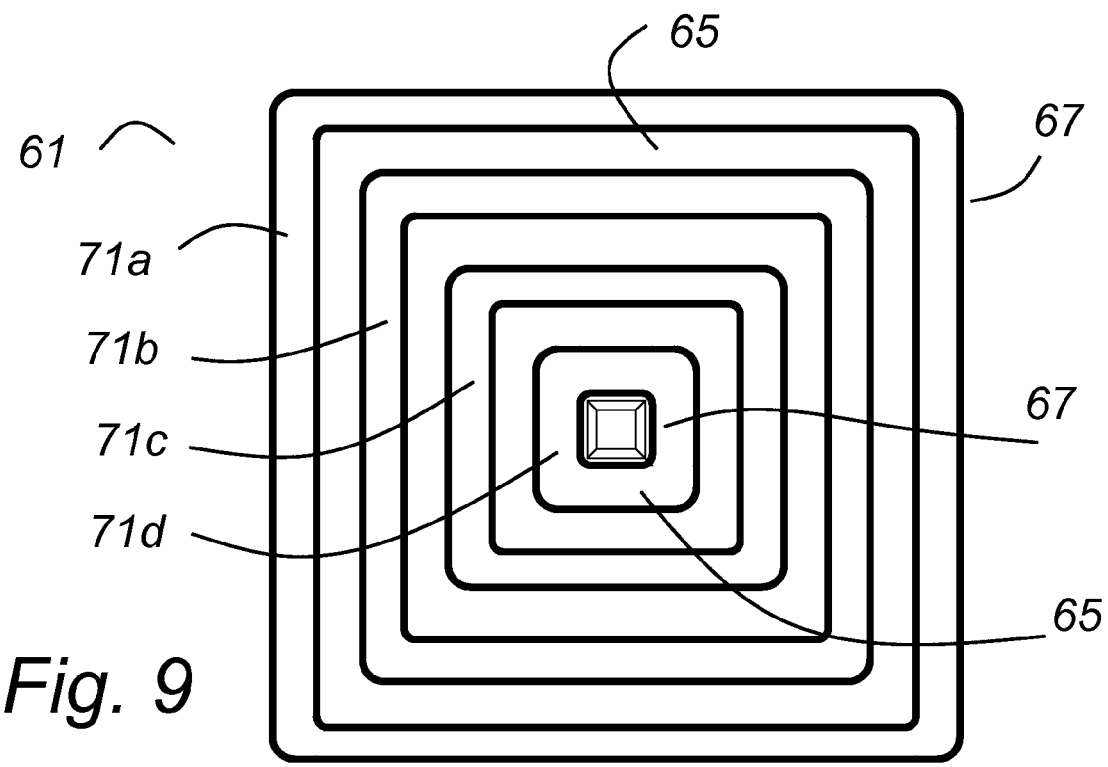
FIG. 9 shows a bottom view of the same four internal layers of an interposer.

FIG. 5 shows a top perspective view of the internal layers of the interposer 61 of FIG. 4. FIG. 6 shows the interposer 61 with a partial cutout to see the inside construction. FIG. 7 is an exploded view. FIG. 8 shows a top view, and FIG. 9 shows a bottom view. Four nested shells 65 are shown, and each shell may comprise a printed circuit laminate with copper on the top and bottom surfaces and with insulation in between. This laminar arrangement would be familiar to anyone who is familiar with the art of printed circuit manufacture, except in this invention the laminate is drawn to be nested three dimensional circuit layers. The laminate may be drawn as a three layer laminated structure (copper-insulator-copper) if the materials are appropriate. Copper draws well, but the insulation must have some elasticity, and the usual woven glass epoxy may not form well. There are many suitable insulating material that would form well, as examples, not limitations, Teflon(r), epoxy glass felted mat, and so forth. The depth of the draw is exaggerated in the drawings, for illustration. An actual interposer is a few millimeters thick.

In this specification and the claims, "copper" is recited as it is the usual material for printed wiring board fabrication, but any conductive material may be used. When copper is recited as a conductive material, any other conductive material is included by definition.

Alternatively, to have better mechanical stability (lower thermal expansion, stiffer, better match of thermal expansion to that of a silicon IC, etc.), some or all of the metal shells may be an alloy that has a lower thermal expansion, such as stainless steel, as an example, not a limitation. Stainless steel has a much lower dc conductivity than copper, but for very fast signals, the dc conductivity is not very important. What is important is the effective conductivity at the frequency of interest. The penetration depth is deeper in a lower conductivity material, so the effective resistance of a low conductivity material may be comparable to copper. Or, a stainless core might be plated up with copper. The clad material thus resulting would have mixed characteristics, but the higher strength of the stainless steel would dominate and control the thermal expansion while the copper cladding would provide suitably low conductivity, both at dc and at the frequency of interest.

The laminates shown may then be coated with photo-resist, exposed to light, the photo-resist may be developed and the copper may then be etched just as any printed wiring board would be. Representative landlines 73 are shown in FIG. 8, though it is to be understood that the entire surfaces of the all of the copper laminate surfaces may be etched to make the many conductors of an interposer. Where many contacts are adjacent and common, a single wide trace may be used. It is preferred to leave as much copper as possible, removing only a thin line for insulation, as this increases electrical conductivity and thermal conductivity.

Figure 10:
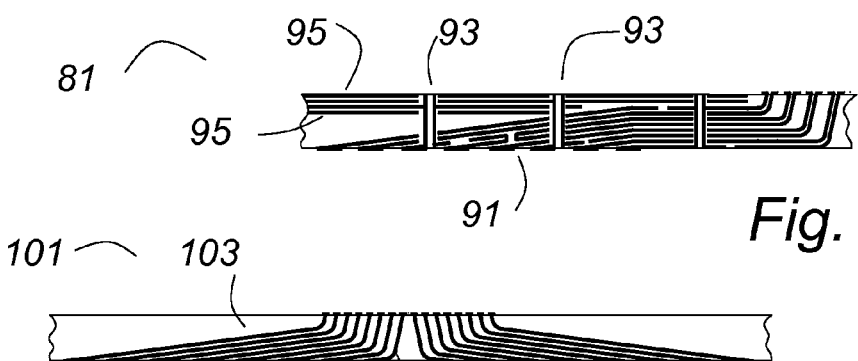
FIG. 10 shows a partial sectional view of an interposer of this invention showing that vias may be used and that extra layers may be added for additional internal traces.

Because usual printed wiring materials are used, and the methods are adapted from usual printed wiring manufacturing techniques, all of the art of printed wiring manufacturing is applicable. FIG. 10 shows a partial section of an interposer 81, which may be the interposer 61 of FIGS. 5 through 9 assembled with additional laminated layers 95-95 to facilitate internal connections. The internal layers can be connected with vias 91, 93-93 just as any multilayer board would be. A via 91 through a single laminate layer is shown, as well as several vias 93-93 through the entire assembly. The extra layers of laminate 95-95, facilitate cross patching within the interposer 81.

A difference is that a flat photo mask would not be suitable, but special masks conforming to the contours of the copper could be used as contact masks with exposure to light to expose the photo-resist. Laser light would be well suited to exposing landline traces in whatever pattern was needed, inside and out. If computer controlled, mask changes would be a matter of re-programming, and it would be feasible to make variations in the interconnections as long as the underlying physical shape was the same.

Figure 11:
FIG. 11 shows an interposer of this invention having eight conductive layers.

In the interposer 101 of FIG. 11, the several conductive layers 103-103 are individual metal drawn copper shells 103-103, not two sided laminates as in the above figures. As before, there must be insulation between the drawn copper shells 103-103. On possible arrangement is to use pre-preg laminate material between the drawn copper shells 103-103 where they are closely spaced and parallel with filler pieces or potting where the spacing is greater. Alternatively, molded insulated shells can be used, as illustrated and shown in more detail in subsequent figures. While this arrangement requires forming and assembling more individual pieces, there is much better control of the parts, and the spacing of the conductive layers on the top is much more controlled and even. Because the individual layers 103-103 are separate stampings, it is easy to incorporate special features, for example, the bottom contacts could have dimples or bumps, as examples, not limitations, and the circumference can be controlled with more precision.

The several drawn copper shells 103-103 and their molded insulators preferably are not fabricated as many loose pieces. A sheet of copper can be drawn with all of the drawn copper shells stamped into one area at the same time and the molded insulators can also be in one large piece. They can be laminated in sheet form and all can be processed together through the process of applying the photo-resist and etching. Then the parts can be cut apart, stacked and bonded. For large scale production, as interposers usually would be, the copper sheet can be a continuous roll with step and repeat stampings. When the parts are cut apart, one layer can remain connected to other like layers so that the finished interposers are still in a connected roll.

"Drawn" is used to describe the shape of the copper shells as an example, not a limitation, because it is a common to form sheet metal to a three dimensional object by stamping and drawing. However, any process in which the desired shape is fabricated is included by definition. Another example may be deposition of the copper on a shaped substrate and may include additional plating to build up the thickness. "Molded" is used to describe the shape of the insulating laminate as an example, not a limitation, because it is common to form plastic parts into intricate shapes by molding. However, any process in which the desired shape is fabricated is included by definition.

The copper in the drawn shells can be very thick, as compared to the copper used in prior art interposers, and the conductors can be comparatively wide, as no space needs to be wasted to provide clearance for vias, particularly in the crowded area near the die. The thickness of the copper with its insulation can approach the pitch of the contacts for the integrated circuit die. As an example, a die with a contact pitch of 0.20 mm could use copper up to 0.10 thick with insulation up to 0.10 mm thick. This is extraordinarily thick, far thicker than may be necessary and thick enough so that clean etching may be a problem. It is contemplated that industry standard 2 oz. copper (0.071 mm) may be used for the power and ground connections where as ½ oz. copper may be used for the logic connections. It is contemplated that using 2 oz copper for the power and ground connections could reduce the resistance more than an order of magnitude, to the order of 20 µΩ, as compared with 340 µΩ in a typical prior art interposer. It is harder to estimate the improvement in parasitic inductance, but the shorter, more direct and heavier traces should be significantly improved over the plurality of thin traces and vias of prior art interposers.

In this specification and the claims, a connection is defined as a "direct connection", or is said to be "connected directly" if an electrical conductor connects different points on one or the other surface of the interposer without using any vias in the conduction path. A conductor that makes a direct connection between two different points on surfaces of an interposer may have vias to other conductors (connections that are not direct) as branch circuits, but the conduction path defined as a direct connection is a conduction path etched in a single copper foil layer without interruption from one end of the conductor to the other.

FIGS. 12 through 15 show an interposer 121 that is similar in internal construction to the interposer 101 of FIG. 11, but the bottom contacts 123-123 are formed cantilever springy contacts extending from the bottom of the interposer 121. These contacts 123-123 provide a resiliency to accommodate any irregularities in a mating surface. It is contemplated that such an interposer could contact directly with a motherboard with no connector, which would represent a significant savings as well as eliminating a source of extra unwanted impedance. When the conductors of an interposer are extended and formed to make resilient contacts on the surface of the interposer, it is preferred to use an alloy that has good spring characteristics. While such alloys tend to have lower conductivity than pure copper, many have good enough conductivity to be useful as printed wiring board foil. Some observations are in order. One is that lower dc conductivity can be compensated by using thicker foil. Another is that the penetration depth in a lower conductivity material is greater, so the apparent resistance at a frequency of interest may be comparable.

Figure 12:
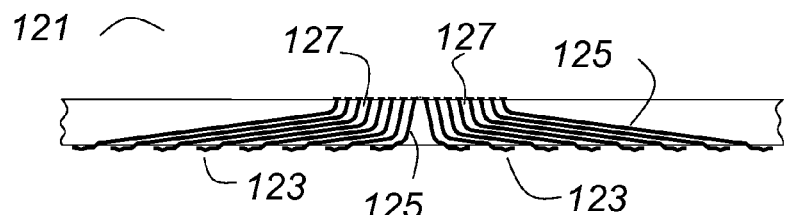
FIG. 12 shows an interposer of this invention in which the conductive foils are extended, etched and formed to be contacts to a motherboard.
Figure 13:
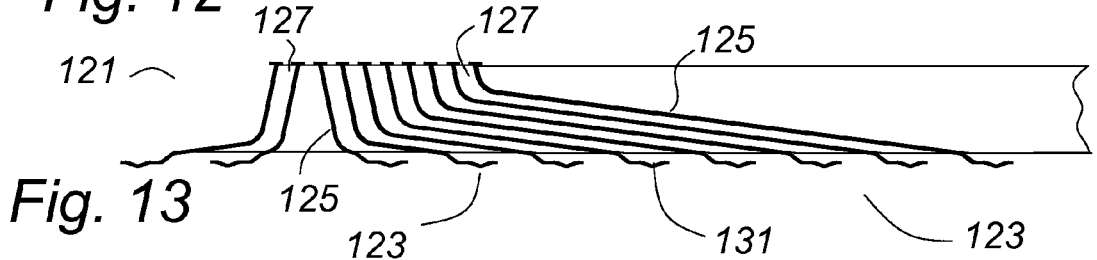
FIGS. 13 through 15 show details of the subassemblies of the interposer of FIG. 12.
Figure 14:
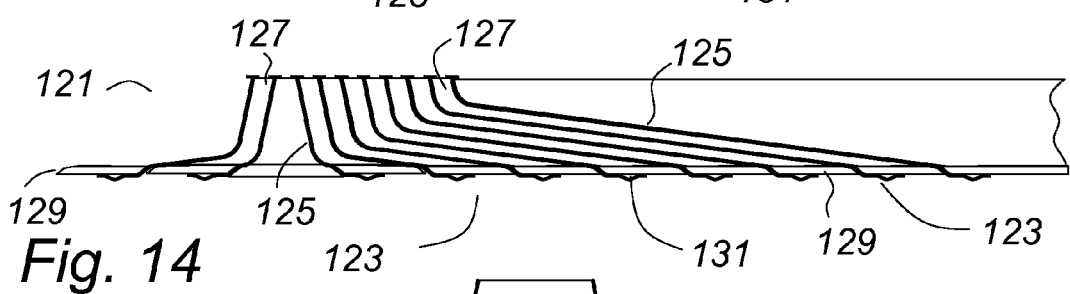
Figure 15:
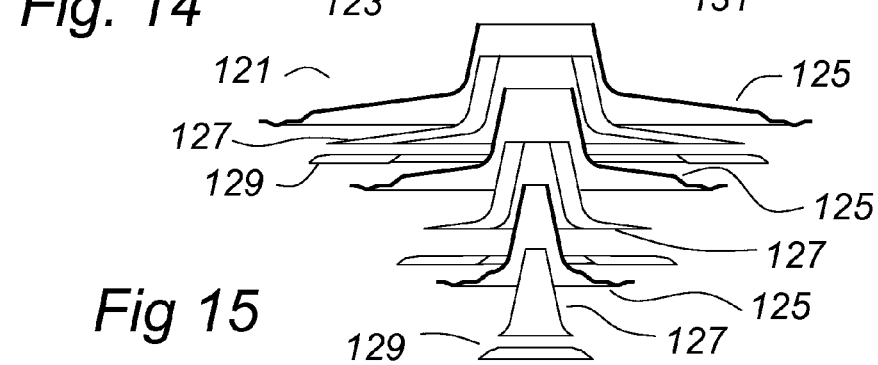

FIGS. 13 through 15 show the subassemblies to make the interposer 121 of FIG. 12. Keep in mind that these are partial sections of shells that may have the general shape of the laminates shown in FIGS. 5 through 8 in that they are drawn and can be nested. First, as series of copper shells 125-125 are formed, as by drawing, as an example, not a limitation. The copper shells 125-125 are bonded to complimentary insulating shells 127-127 so as to form a single sided laminate with insulation on the inside and copper on the outside. Once bonded, the copper may be coated with a photo resist, exposed, and etched using the usual techniques of the printed wiring industry to make as many or as few conductors are as needed. For conductors carrying power or ground, it is preferred that they be uninterrupted relatively straight lines of maximum width. There would be good reasons to use entire shells as return conductors: Not only would they be very good, low impedance ground returns, but also an uninterrupted metal shell would have better mechanical stability than one that has etched conductors. Conductors carrying logic may use vias and crossing landlines to rearrange the order of the connections as desired to accommodate data buses on a motherboard, as an example.

FIGS. 13 through 15 show that the bottom edge of the copper shell 125 can be formed in the profile of a springy contact 123, including such features as a rounded contact bump 131, if desired. To protect the contact profile from crushing during the bonding process, temporary filler rings 129-129 may be used, as shown in FIG. 14. These temporary filler rings 129-129 are contemplated to be of a material that is strong and stable enough to withstand the rigors of processing but that can be easily removed at the end. Perhaps they are elastic enough to be pulled out and reused, or perhaps they are dissolved or melted. Regardless, once the temporary rings are removed, the contacts 123-123 remain extended from the bottom surface of the interposer 121.

FIG. 15 is a partial exploded view of the interposer 121 of FIGS. 12 and 13. It is contemplated that the copper parts are all parts of a copper sheet or roll and that the insulator parts are all part of one molding in general sheet or roll form, and that the copper parts and the insulator parts can be bonded and laminated all together as a sheet or roll. Next, it is contemplated that the copper is coated with photo-resist, exposed, and developed to define the landlines of the interposer 121. Except for working with a three dimensional shape, all of the usual process of printed wiring board manufacture can be employed in the usual manner. The various parts of the interposer assembly can then be separated as by routing, shearing, sawing or otherwise cutting apart (though one layer may remain attached to other like layers as a roll). They are then stacked and bonded to make the finished interposer 121.

There are alternatives to using the temporary rings 129-129. If the insulating material is sufficiently rigid, successive shells may have recesses that receive the contacts of the adjacent shells and protect them from being over-stressed when the assembly is compressed. Alternative, the pressing plate may have recesses to receive the contacts and protect them from being over-stressed. Finally, it may be that the pressing pressure does not exceed the elastic limit of the contacts, in which case, no protection is required.

Figure 16:
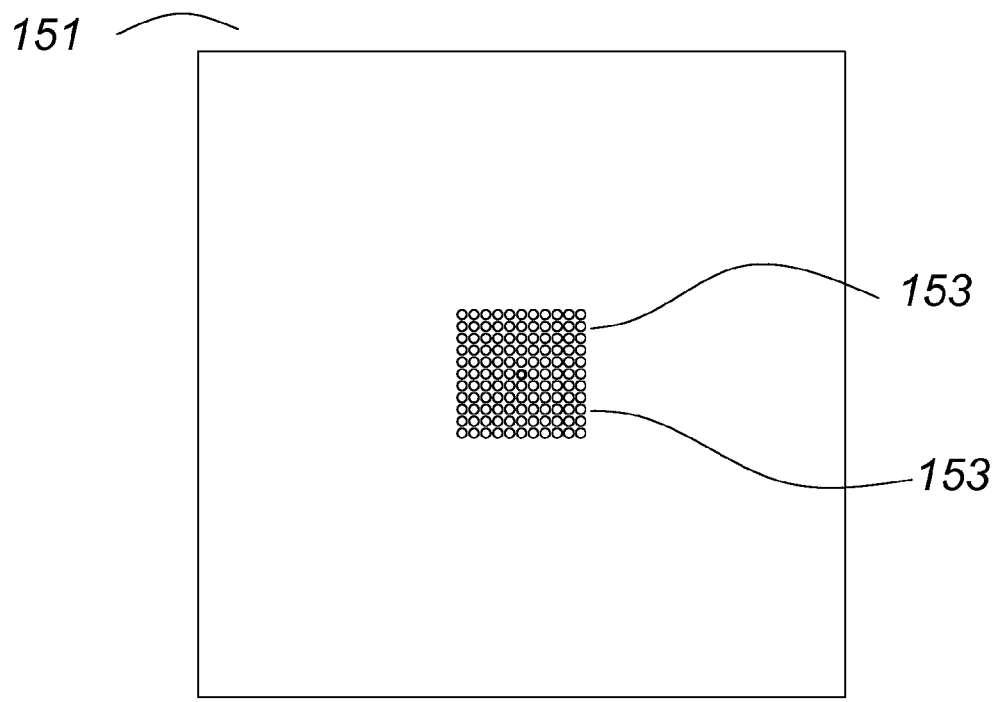
FIG. 16 shows a top view of a finished interposer of this invention.
Figure 17:
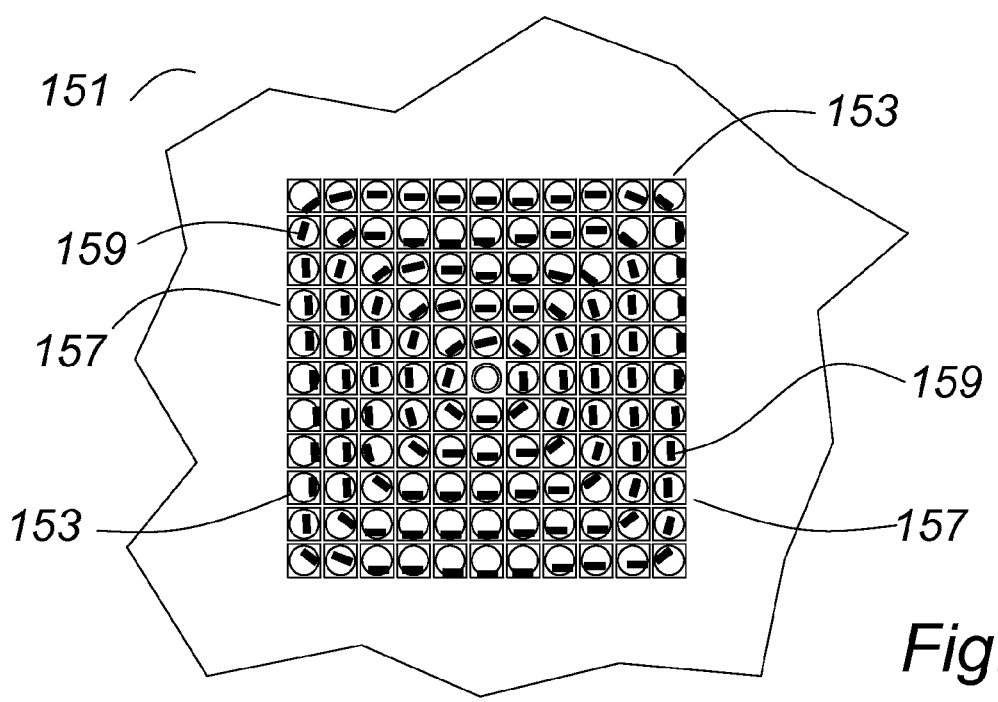
FIG. 17 shows an enlarged view of the finished interposer of FIG. 15 showing the connections to the internal conductive layers.

FIGS. 16 and 17 show a representative top view of an interposer 151 having top contacts 153-153 for connecting to an integrated circuit die, FIG. 16 being a partial view of much greater scale. In FIG. 16, the top edges of the conductors 159-159 can be seen. As it would be difficult to precisely control the location and height of the nested conductors to the necessary precision for attachment to an integrated circuit die, it is contemplated that excess material would be used in this area and that after assembly and curing, the area of the contacts would be machined flat, leaving the exposed ends of the conductors 159-159 in a plane surface. The exact form of the finished contacts would be a trade off of the design, but a representative method would be to then copper plate the entire surface followed by coating with a photo resist, exposing and plating the contact areas 157-157, shown as squares with circles. The periphery may chrome, as an example, not a limitation, and the center may copper or it may be plated with another material. Another application of a photo resist, exposure and etching then removes the copper between the contacts. Finally, solder balls 153-153 or the like can be applied, though more likely, the pads would receive solder from solder balls on the processor IC. The design of the contacts is not a point of novelty, and any method of making contacts presently used or adapted from present use or discovered in the future are suitable for this step of production.

As shown in FIGS. 18 through 21, alignment of the conductors 185-185 with the contact areas 187-187 is not assured within an interposer 181, and it is particularly difficult when the drawn shells are two sided laminates, as the spacing between the conductors 185-185 on the two sides of the laminate will be very close. This is desirable from the point of view of minimizing inductance, but accommodating the variation in position requires extra manufacturing steps and procedures. As before, it is contemplated that extra material would extend above the interposer and it would be machined to provide a suitable flat contact surface. It may also be desirable to etch back the insulation somewhat, to remove any smears on the copper.

At this point, the contacts are exposed and are easily visible. While their precise locations may not be know, their relative positions will be correct. Because they are etched on a laminate, they cannot be crossed over or otherwise rearranged to make their connections indefinite. At this time, a photo image can be scanned for processing. The entire surface can then be deposited with copper, then coated with a photo resist. Using the image scanned before the copper was deposited, the correct interconnection pattern can be computed and exposed by laser. After etching, a pattern such as is shown in FIG. 19 will result. From every conductor 185-185, a copper landline 189-189 will connect to its correct contact area 187-187. In some, the contact area 187-187 will be partial, and there may be other conductors and landlines intruding, but as long as some significant copper area is in the correct location, the interposer can be used. Only if the conductors are so out of location that good connections cannot be made would a part have to be discarded.

Next, a photosensitive insulating layer may deposited, exposed and developed to make insulated areas 191-191 to insulate those portions of a contact copper area which intruded into the space of another contact, as shown in FIG. 20. Then another layer of copper can be deposited and coated, plated, etched or whatever to make the final contacts 187-187, as shown in FIG. 21.

A similar method can be used for more extreme misalignments. More extreme misalignment may be partly by design. As an example, the laminates may be cones of circular section and the extended landlines at the top would be in concentric circles. The solder balls on a processor IC may be on a rectilinear grid. One pattern can be translated to another by a succession alternating layers of plated copper and layers of insulation, the copper conductors overlapping to make layer to layer contact and each extending further toward its desired end location until the desired pattern is accomplished.

Although the spacing between the conductors is shown as being even, this is not necessarily optimum and is a tradeoff of design. It may be that some of the conductors are extra thick with more space between them, particularly power and ground return conductors. If a top mounted power source is used, as an example, the outer rings of conductors, from the top layers of the interposer, may be much thicker, and thus more widely spaced and some of them may lie beyond the die contact area. The two deposited copper layers with an insulating layer between them could carry current to the die as a good low impedance path.

As can be seen in FIGS. 11 trough 14, and as contrasted with FIG. 3, when the conductors rise at a steeper than the optimum angle for tight nesting, there is extra space between the conductors that must be filled using extra filler material. FIG. 22 shows a cross section of one layer 201 of an interposer 203. Insulating backing material 205 under a conductive shell 207 incorporates a metal ring, shown in section. FIG. 23 shows a section of an interposer 203 showing a set of metal rings 209-209 installed therein, and FIG. 24 shows a top view, though preferably the metal rings 209-209 would be below the surface and covered with some insulating filler material. While the metal rings 209-209 could be metal bands in a square geometry, one advantage of using metal rings here is that they could help control thermal expansion if the rings had a low thermal expansion and a high strength. In a square pattern, the sides could bow, but a circle would be stable. Further, the depth of the rings would provide a very rigid structure with no flexing possible across the surface on which a semiconductor die would be placed. A square die could be designed to locate on a circular contact pattern, with pattern translation as described above. Stainless steel or some similar alloy may be suitable to stabilize the mounting surface, particularly if an insulating medium with some resiliency is chosen, perhaps a high-density foam. Preferably the metal rings 209-209 would be non-magnetic. Though shown as being insulated from the copper conductors, the rings could be connected to ground, or alternately to power and ground to supplement the conductivity of the copper conductors and further reduce the impedance of the power and ground connections.

FIGS. 22 and 23 also show extended cantilever contacts 211-211. In contrast to the contacts 123-123 of FIG. 12, the contacts 211-211 are formed inward. Temporary filler material 213 keeps the contacts 211-211 from being over stressed during bonding.

FIG. 25 shows an interposer 221 that is adapted for mounting two dice 223,223. Note also that some of the copper layers 225 and 227 do not extend to the bottom surface. It is important to keep the power connections short and solid, but the logic connections may well have to be cross patched using usual multilayer techniques and vias so as to be optimally ordered on the motherboard. It is preferred to have no vias under the dice, and, while possible, it would be difficult to locate them there. Further out, for low current logic lines, there is no reason not to use vias and cross connected land lines as necessary. In FIG. 25, the short central conductors 225 may carry the power and ground while most of the peripheral conductors 227 may carry logic signals. As required, some peripheral contacts on the dice may carry power or ground and some of those connections may be made using vias and cross-connected landlines as needed.

FIG. 26 shows that some of the copper layers 233-233 may connect to the top of the interposer 231. If a source of power is located above the interposer, the outer contacts 235-235 may carry the power and ground. As they are relatively very much wider, the impedance may be lower. In this way, the total area of the interposer may be smaller, with the contacts divided among the top and bottom surfaces. For some applications, all of the layers could extend upward, though it may be preferred to carry the layers contacting the center of the die outward only sufficient distance to make connections through vias to layers above them.

FIG. 27 shows that cooling pipes 243-243 can be incorporated into the interposer 241. The copper conductors extending down and radiating from the die are excellent heat spreaders. Even without cooling pipes, significant heat can be conducted away from the die through the conductors of the interposer.

Figure 28:
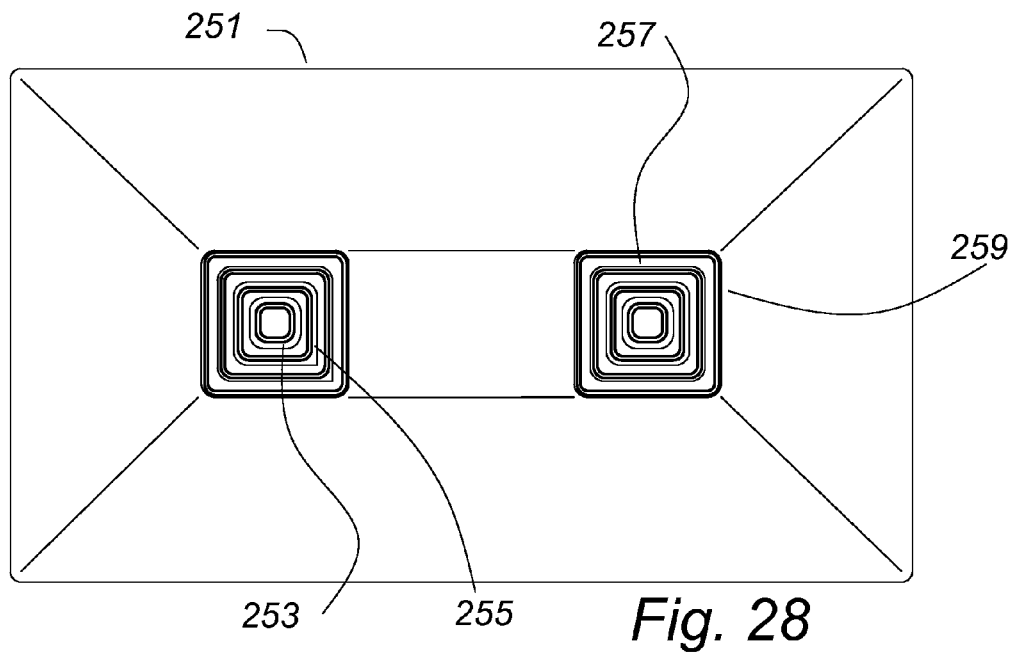
FIG. 28 shows a top view of four internal layers of an interposer for two dice.
Figure 29:
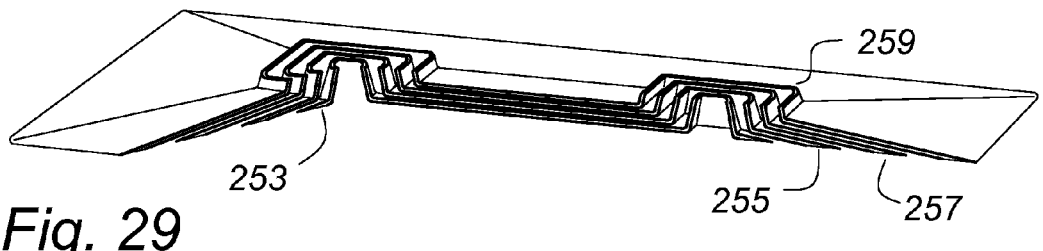
FIG. 29 shows a partial cutaway in perspective of the same four internal layers.

FIGS. 28 and 29 show, respectively, a top view and a perspective cut away view of an interposer 251 for two dice. As before, the copper surfaces of the nested laminates 253 to 259 are etched, plated and otherwise processed using methods adapted from printed wiring board manufacture to make individual conductors to the die, including crossed landlines and vias as required. It is also apparent that the top layers could flare upward rather than downward, to make top connections on an interposer. As before, it is pointed out that these are laminated copper surfaces which can be etched as desired to make land lines and vias can be used in any area where a hole can be drilled provided that clearance has been provided in the layers to which no connection is to be made, as would be well known to one skilled in the art of printed wiring boards.

Figure 30:
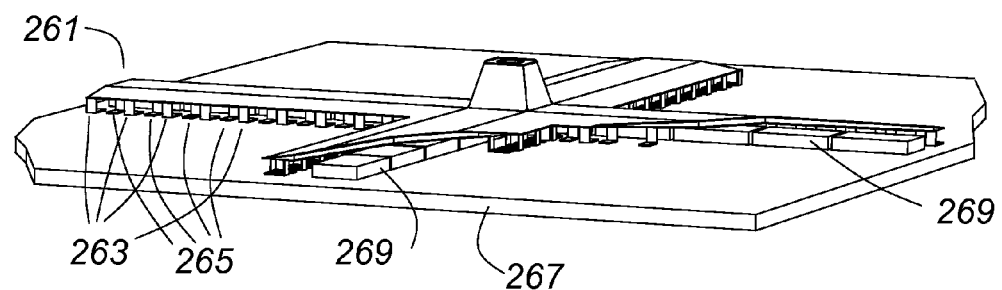
FIG. 30 shows a method for making a very low impedance connection for power and ground.

FIG. 30 shows one layer 261 of a laminated interposer comprising a low impedance power connection to a motherboard 267 on which a number of decoupling capacitors 269-269 have been mounted. The power contacts 263-263 and return contacts 265-265 are interdigitated and straddle the capacitors, making contact optimally close for minimum impedance, particularly low leakage inductance. Interdigitated capacitors may be used, but even usual low inductance capacitors such as 0612 size MLCCs may be used. The power and ground is illustrated as being continuous, but it can be divided to provide multiple voltages. As an illustration, not a limitation, one of the copper laminates could be etched at the common central corners to divide the power into four voltages, perhaps for four cores of a multi-core processor.

The optimum arrangement for minimizing the impedance from the capacitors to the processor die is a worthwhile endeavor, as it optimizes the ability of the processor to change mode rapidly. A change in mode may be accompanied by a change in current (di/dt), and a lower impedance to the capacitors accommodates a greater di/dt. The difficulty of making the drawings prevents showing a large number of possible arrangements, but the concept of using a large number of interdigitated power and ground contacts interspersed among the decoupling capacitors is the concept. Whether the arrangement is a cross, as shown, or an "H" or a square, a square with a cross in it, a tree, parallel rows or whatever is a tradeoff of a particular design. The shortest paths are from the center of the bottom, but peripheral paths from the top are wider, noting FIG. 26, and may be preferred in some designs.

Figure 31:
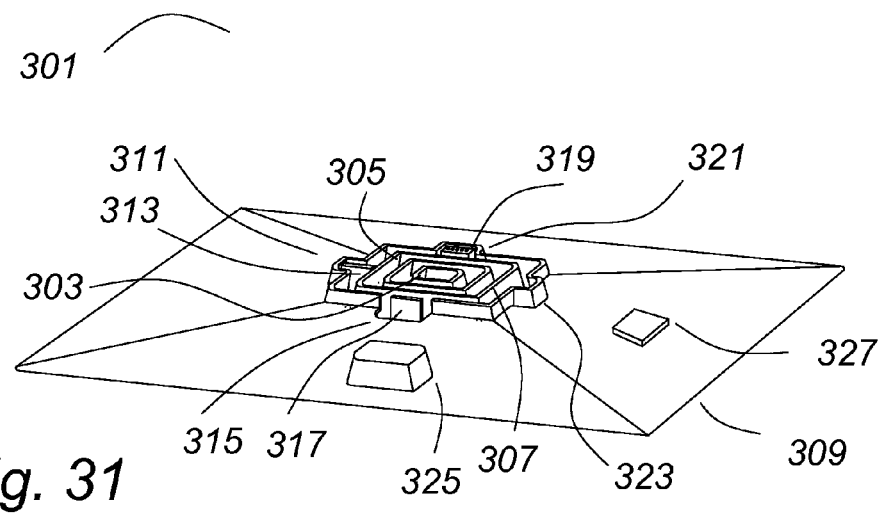
FIG. 31 shows an interposer with components mounted therein.

FIG. 31 shows the internal layers of an interposer 301, which is similar to the interposer 61 of FIGS. 5 through 9. The interposer 301 comprises four laminated layers 303 to 309, and several special features are incorporated into the interposer 301 to illustrate the flexibility of three dimensional printed wire board fabrication.

Interposers are special purpose printed wiring boards, and that application will benefit particularly from the teachings of this invention. However, printed wiring boards are made for many diverse uses and products, and all may benefit as well. In this specification and the claims, when an "interposer" is recited, other printed wiring boards and similar assemblies are included.

On the left side of the interposer 301, the top layer 309 has been formed to make a protrusion 311. A capacitor 313 has been installed and soldered between the outer surface of the laminate layer 307 and the inner surface of the laminate layer 309. This is as an illustration, not a limitation, to show that components can be installed layer to layer.

On the facing side, a notch 315 has been cut into the top layer 309 to provide clearance for a component 317 that is mounted on the outer surface of the laminated layer 307. On the backside, a protrusion 321 has been formed to provide a pocket into which a component 319 is inserted. In this example, the component does not connect to the interposer 301. Its terminals extend upward and will be exposed on the top surface of the finished interposer, to make direct connection to the IC chip. Misalignment of the terminals may be corrected in the manner of FIGS. 18 to 21. On the right side, a protrusion 232 contains nothing. It provides clearance for a component that may be already installed on the IC chip when it is put onto the finished interposer.

The surface of the laminated layers are very much the same as an ordinary printed wiring board. An IC 327 is installed on the surface of the top laminated layer 309. Finally, a protrusion 325 in the top laminated layer 309 may provide clearance for a component installed on an inner laminated layer. A clearance hole through one or more laminated layers may provide the same function. The lesson is that once the layers of a printed wiring board are formed in three dimensions, other features can be incorporated as needed so long as the layers nest closely.

Figure 32:
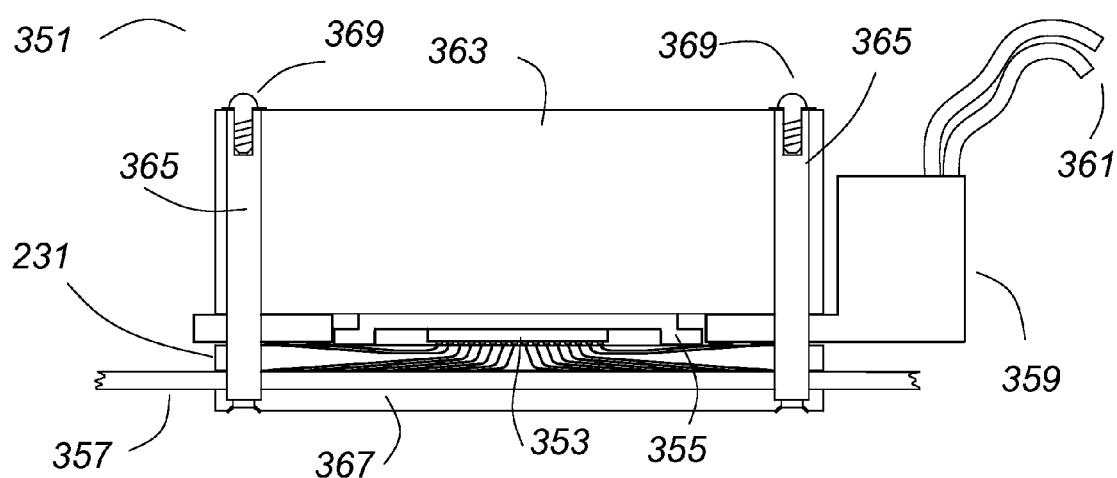
FIG. 32 shows an interposer with a processor package, on a motherboard with a power module and heat sink.

FIG. 32 shows an assembly 351 using the interposer 231 of FIG. 26. A processor IC 353 and a cover 355 are installed on the interposer to make a commercial processor component. The interposer 231 mounts directly on a motherboard 357 without a socked. Resilient contacts, in the manner of FIG. 13 or 23 may be used, but it is contemplated that the contacts may press directly on complementary contacts of the motherboard 357 to make the electrical connections between the interposer 231 and the motherboard 357. A fan assembly 363 is mounted on top of the processor package, and it is retained by posts 365-365 staked into a backing plate 367 and screws 369-369. A power supply module 359 has a hole in it conforming to the cover 355 of the processor package, and it makes contact with the top of the interposer 231. The power supply module also contacts the fan assembly 363. It is contemplated that either the interposer 231 or the power supply module 359 would have resilient contacts and that the power supply module 359 would be urged against the fan assembly 363 by the spring force of the resilient contacts so that the full clamping force of backing plate 367, the posts 365-365 and the screws 369-369 compresses the fan assembly 363 to the cover 355 of the processor package. It is further contemplated that the backing plate 367 have a controlled curvature so that it applies consistent force across its surface when the screws 369-369 have bottomed out. A resilient pad between the motherboard 357 and the backing plate 367 may be used as well, to insulate the parts and ensure good conformance.

What is claimed is:

1. An interposer comprising
a plurality of laminates comprising copper foil and insulation,
said copper foil comprising a plurality of conductors etched therein,
said plurality of laminates being bonded together as a printed wiring board,
said plurality of laminates being formed as nested shells such that a plurality of said plurality of conductors extend to at least one surface of said interposer for making direct connections thereto.

2. The interposer of claim 1 further comprising a fine pitch connector pattern on a first surface of said interposer and a coarse pitch connector pattern on a second surface of said interposer, wherein said plurality of laminates are formed as nested shells generally in the shape of funnels, such that said fine pitch connector pattern on said first surface of said interposer is connected directly by said plurality of said plurality of conductors to said coarse pitch connector pattern on said second surface the interposer.

3. The interposer of claim 2 wherein the fine pitch connector pattern conforms to the termination pattern of an integrated circuit and wherein the coarse pitch connector pattern on a second surface of the interposer conforms to and is in registration with at least a coarse pitch connector pattern on one of a printed wiring motherboard and a connector mounted on a printed wiring motherboard.

4. The interposer of claim 3 further comprising a second fine pitch connector pattern that conforms to the termination pattern of a second integrated circuit.

5. The interposer of claim 1 wherein at least a first plurality of the plurality of laminates of copper foil and insulation are formed as nested shells such that the plurality of conductors etched therein return to the same surface from which the first plurality of the plurality of conductors etched therein originated.

6. The interposer of claim 1 wherein at least a first plurality of the plurality of laminates of copper foil and insulation are formed as nested shells generally in the shape of funnels, so that a fine pitch connector pattern on a first surface of the interposer is connected directly by a first plurality of the plurality of conductors to a coarse pitch connector pattern on a second surface the interposer, and
wherein at least a second plurality of the plurality of laminates of copper foil and insulation are formed as nested shells such that a second plurality of the plurality of conductors etched therein return to the same surface from which the second plurality of the plurality of conductors etched therein originated.

7. The interposer of claim 1 wherein at least one of the plurality of laminates of copper foil and insulation further comprises formed extensions of the plurality of conductors etched therein to make resilient contacts on at least a first surface of the interposer.

8. A method of fabricating an interposer, the method comprising
drawing a plurality of copper foils to be a plurality of nesting copper foil shells,
molding a plurality of insulators so that one surface respectively of each of the plurality of insulators conforms respectively with one of the plurality of nesting copper foil shells, and
a second surface respectively of each of the plurality of insulators conforms respectively a second one of the plurality of nesting copper foil shells,
bonding each of the respective plurality of nesting copper foil shells to a respective one of the plurality of insulators to which it conforms,
etching the plurality of nesting copper foil shells to define a plurality of conductors thereon,
assembling the plurality of copper nesting copper foil shells and the plurality of insulators as a nested stack, and
bonding together the plurality of nesting copper foil shells and the plurality of insulators, such that a plurality of said plurality of conductors extend to at least one surface of said interposer for making direct connection thereto.

9. The method of claim 8 further comprising
machining at least a portion of at least a first surface of the interposer so that ends of the plurality of conductors that terminate on the at least a portion of at least a first surface of the interposer are exposed and lie in a plane.

10. The method of claim 9 further comprising
first depositing copper onto the ends of the plurality of conductors that terminate on the at least a portion of the at least a first surface of the interposer, then
etching the copper that was deposited onto the ends of the plurality of conductors that terminate on the at least a portion of at least a first surface of the interposer so as to define a contact area for each of the plurality of conductors that terminate on the at least a portion of at least a first surface of the interposer.

11. The method of claim 10 wherein the pattern of the etching of the copper that was deposited onto the ends of the plurality of conductors that terminate on the at least a portion of the at least a first surface of the interposer is derived from a scan of the ends of the plurality of conductors that terminate on the at least a portion of at least a first surface of the interposer.

12. The method of claim 8 further comprising
further forming at least a plurality of the plurality of conductors such that at least one end of each of the at least a plurality of the plurality of conductors comprises a resilient cantilevered contact.

* * * * *